United States Patent
Yanagi

(10) Patent No.: US 8,053,305 B2
(45) Date of Patent: Nov. 8, 2011

(54) METHOD FOR PRODUCING SEMICONDUCTOR DEVICE

(75) Inventor: Masahiko Yanagi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/805,930

(22) Filed: Aug. 25, 2010

(65) Prior Publication Data

US 2011/0053325 A1    Mar. 3, 2011

(30) Foreign Application Priority Data

Aug. 28, 2009   (JP) ................. 2009-198973

(51) Int. Cl.
*H01L 21/8238* (2006.01)
(52) U.S. Cl. .......... 438/223; 257/E21.632; 257/E21.642
(58) Field of Classification Search .......... 438/223; 257/E21.632, E21.642
See application file for complete search history.

(56) References Cited

U.S. PATENT DOCUMENTS

| 2009/0159966 A1* | 6/2009 | Huang | 257/334 |
| 2009/0209077 A1* | 8/2009 | Lowis | 438/296 |
| 2010/0032774 A1* | 2/2010 | Burgess et al. | 257/408 |
| 2010/0289081 A1* | 11/2010 | Griebenow | 257/351 |

FOREIGN PATENT DOCUMENTS

| JP | 04-025168 | 1/1992 |
| JP | 04-188762 | 7/1992 |
| JP | 7-254645 | 10/1995 |
| JP | 2001-168207 | 6/2001 |

* cited by examiner

*Primary Examiner* — Thao P. Le
(74) *Attorney, Agent, or Firm* — Harness, Dickey & Pierce, P.L.C.

(57) ABSTRACT

The invention provides a method for producing a semiconductor device that can reduce the number of mask steps. In a CMOS production process, gate electrodes are formed in regions for forming an NMOS and a PMOS at the same time with a common mask pattern, and after the gate electrodes have been formed, a well, and source and drain regions are formed by impurity ion implantations with a common mask pattern in each region of the NMOS and the PMOS, using the gate electrode as a mask, whereby the number of mask steps is reduced.

6 Claims, 4 Drawing Sheets

NMOS Region

PMOS Region

N-type Well and P-type Source and Drain are formed by ion implantations.

NMOS Region    PMOS Region

NMOS Region    PMOS Region
N-type impurity ions are implanted.

NMOS Region    PMOS Region
P-type impurity ions are implanted.

Fig. 4A    NMOS Region    PMOS Region
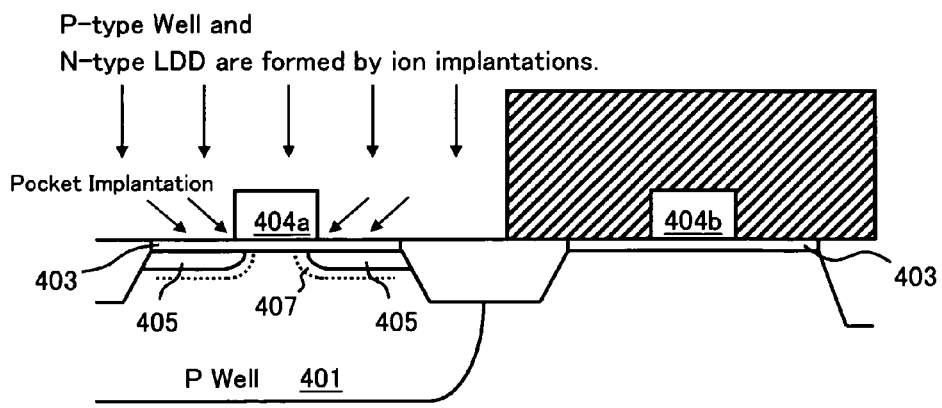
Fig. 4B    NMOS Region    PMOS Region
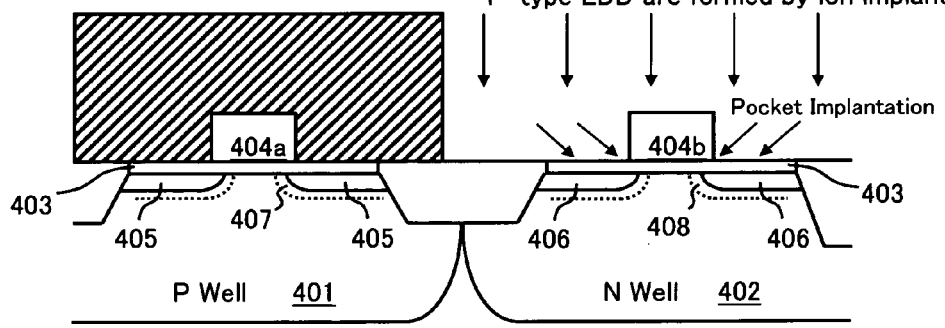
Fig. 4C    NMOS Region    PMOS Region
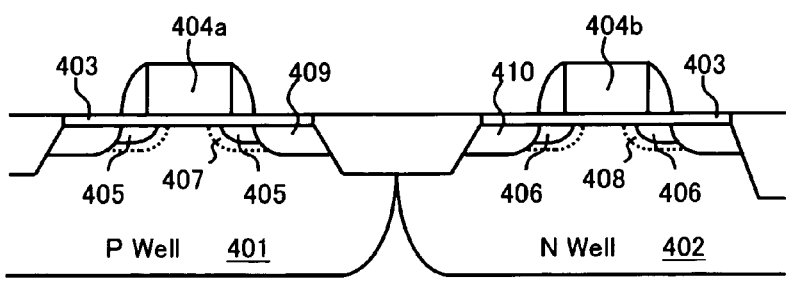

METHOD FOR PRODUCING SEMICONDUCTOR DEVICE

CROSS REFERENCE TO RELATED APPLICATION

This Nonprovisional application claims priority under 35 U.S.C. §119(a) on Patent Application No. 2009-198973 filed in Japan on Aug. 28, 2009 the entire contents of which are hereby incorporated by reference.

BACKGROUND OF THE INVENTION

1. Field of the Invention

The present invention relates to a method for producing a semiconductor device, and more particularly to a method for reducing a mask step in a CMOS production process.

2. Description of the Related Art

In a CMOS production process, following methods have been used as a method for reducing a mask step in forming a gate electrode on a semiconductor substrate, and forming a well, and source and drain regions in the semiconductor substrate by ion implantations.

FIGS. 1A to 1C show a method disclosed in Japanese Unexamined Patent Publication No. 4-25168 (hereinafter, referred to as Document 1). First, a P well 101 is formed in a region (NMOS region) in which an NMOS transistor is formed, and an N well 102 is formed in a region (PMOS region) in which a PMOS transistor is formed, and gate electrodes 104a and 104b are formed on a gate insulation film 103 in the NMOS region and the PMOS region, respectively (FIG. 1A). Thereafter, N-type impurity ions are implanted in a whole surface. In this manner, N-type source and drain regions 105a are formed in the P well, while at the same time, N-type impurity regions 105b are formed in a region in the N well in which source and drain regions are formed.

Then, the NMOS region is covered with a mask, and P-type impurity ions are implanted only into the PMOS region. Thus, the P-type source and drain regions 106 are formed in the P well, and as shown in FIG. 1C, the MOS transistor is formed in each of the NMOS region and the PMOS region.

Next, FIGS. 2A to 2C show a method disclosed in Japanese Unexamined Patent Publication No. 4-188762 (hereinafter, referred to as Document 2). First, a P well 201 is formed in an NMOS region, an N well 202 is formed in a PMOS region, and a gate electrode material 204 is deposited on a whole surface of a gate insulation film 203 (FIG. 2A). Thereafter, the PMOS region, and the NMOS region in which a gate electrode is formed are covered with a mask, and a gate electrode 204a of the NMOS transistor is formed, and N-type source and drain regions 205 are formed in the P well 201 by an ion implantation of an N-type impurity with the same mask pattern (FIG. 2B).

Then, the NMOS region, and the PMOS region in which a gate electrode is formed are covered with a mask, and a gate electrode 204b of the PMOS transistor is formed, and P-type source and drain regions 206 are formed in the N well 202 by an ion implantation of a P-type impurity with the same mask pattern. In this manner, as shown in FIG. 2C, a MOS transistor is formed in each of the NMOS region and the PMOS region.

According to the production method disclosed in Document 1, among steps such as (1) the step of forming the N well, (2) the step of forming the gate electrode, and (3) the step of forming the source and drain regions, in the PMOS region, and (4) the step of forming the P well, (5) the step of forming the gate electrode, and (6) the step of forming the source and drain regions, in the NMOS region, the steps (2) and (5) of forming the gate electrodes are performed with the common mask pattern at the same time, and a mask pattern for the step (6) of forming the source and drain regions of the NMOS transistor is not necessary, so that the required number of mask steps is four.

In addition, according to the production method disclosed in Document 2, the step (2) of forming the gate electrode in the PMOS region, and the step (6) of forming the source and drain regions in the NMOS region are performed with the common mask pattern, and the step (3) of forming the source and drain regions in the PMOS region and the step (5) of forming the gate electrode in the NMOS region are performed with the common mask pattern, so that the required number of mask steps is four.

SUMMARY OF THE INVENTION

It is an object of the present invention to provide a production process in which the required number of mask steps is further reduced to three.

As a first characteristic, a method for producing a semiconductor device according to the present invention to achieve the above object is characterized by including: forming an element isolation film in an element isolation region in a substrate; forming a first conductivity type or second conductivity type well in an active region separated by the element isolation film; forming a gate insulation film on the active region separated by the element isolation film; forming a source region and a drain region having a conductivity type opposite to the conductivity type of the well, in a part of a surface of the substrate in each active region; and forming a gate electrode on the gate insulation film over a channel region formed between the source region and the drain region, wherein the step of forming the well and at least part of the step of forming the source region and the drain region are performed by ion implantations with the same resist mask after the step of forming the gate electrode.

In addition, as a second characteristic in addition to the first characteristic, the method for producing the semiconductor device according to the present invention is characterized in that the step of forming the source region and the drain region includes forming a first low concentration diffusion region having a conductivity type opposite to the conductivity type of the well, and forming a second high concentration diffusion region having a conductivity type opposite to the conductivity type of the well, wherein the step of forming the well, and the step of forming the first diffusion region are performed by ion implantations with the same resist mask.

Furthermore, as a third characteristic in addition to the second characteristic, the method for producing the semiconductor device according to the present invention is characterized by further including forming a pocket implantation region having a conductivity type opposite to the conductivity type of the first diffusion region by an ion implantation, in the channel region along a side surface of the first diffusion region, after the step of forming the gate electrode, and before the step of forming the second diffusion region.

Furthermore, as a fourth characteristic in addition to any one of the first to third characteristics, the method for producing the semiconductor device according to the present invention is characterized in that after forming a first resist mask having an opening part in a predetermined first active region of the active region in the substrate, and covering at least one part of a second active region of the active region except for the first active region, the second conductivity type well, and the first conductivity type source region and the drain region are formed in the first active region by ion implantations, using the first resist mask as a mask, and after forming a second resist mask having an opening part in the second active region and covering the first active region, the first conductivity type well, and the second conductivity type source region and drain region are formed in the second active region by ion implantations, using the second resist mask as a mask.

According to the present invention, in the CMOS process, the gate electrode is formed in an NMOS region and the gate electrode is formed in a PMOS region with the common resist mask at the same time, and the well, and the source and drain regions are formed by impurity ion implantations with a common resist mask in each of the NMOS region and the PMOS region, so that the required number of mask steps is only three, and thereby one step is reduced as compared with the conventional technique. As a result, process cost can be reduced.

Furthermore, the present invention can be applied to an NMOS process and a PMOS process other than the CMOS process, in which a well, and source and drain regions are formed by impurity ion implantations with the common mask pattern, so that the number of mask steps can be reduced, and process cost can be reduced.

In addition, the semiconductor device formed by the production method according to the present invention may be a transistor having an LDD (Lightly Doped Drain) structure. The transistor having the LDD structure is produced by forming low concentration source and drain regions (first diffusion regions) in a well by an ion implantation (LDD implantation), forming an insulation film on a sidewall of a gate electrode, and forming high concentration source and drain regions (second diffusion regions) by an ion implantation, using the sidewall insulation film and the gate electrode as a mask. Since the well and the low concentration source and drain regions are formed by ion implantations with the common mask pattern, in the production method according to the present invention, the number of mask steps can be reduced, and process cost can be reduced.

BRIEF DESCRIPTION OF THE DRAWINGS

FIGS. 4A to 4C are cross-sectional views schematically showing a method for producing a CMOS semiconductor device according to the present invention.

DESCRIPTION OF THE PREFERRED EMBODIMENTS

First Embodiment

Figure 1A:
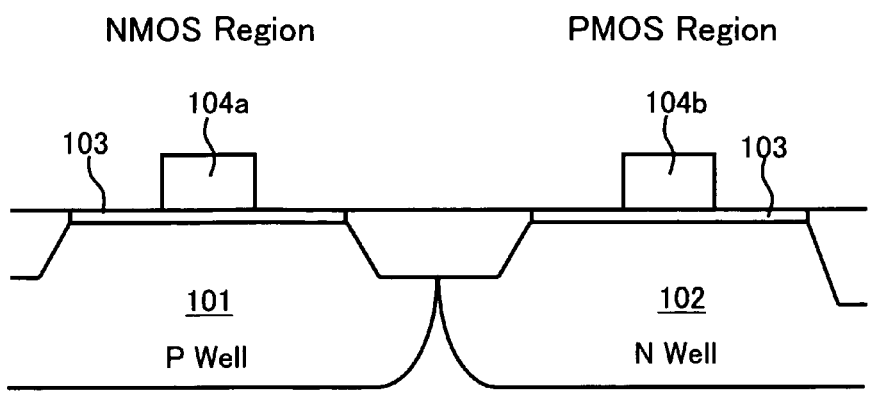
FIGS. 1A to 1C are cross-sectional views schematically showing a method for producing a CMOS semiconductor device according to a conventional technique.
Figure 1B:
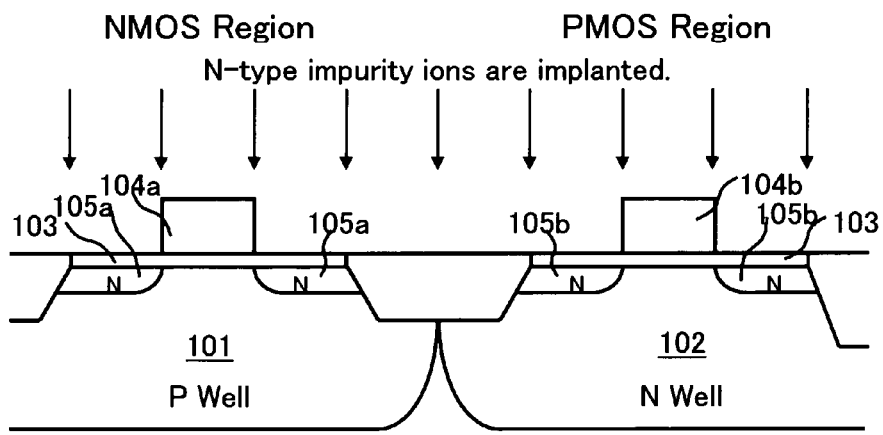
Figure 1C:
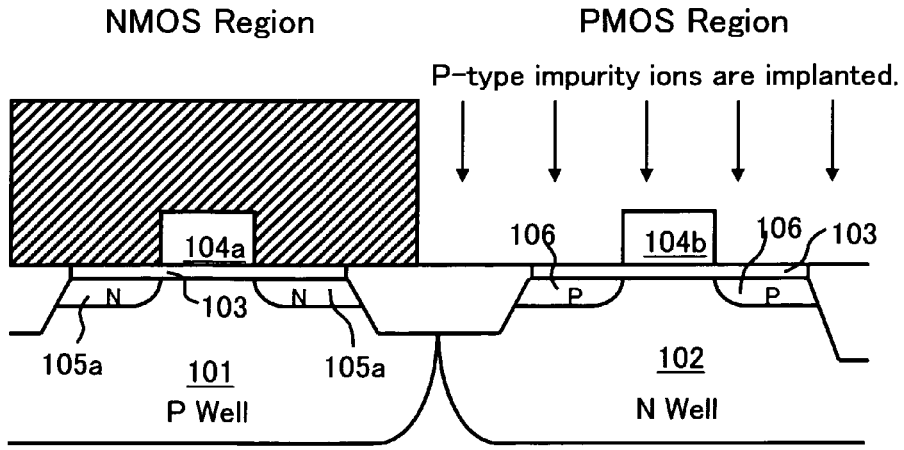
Figure 2A:
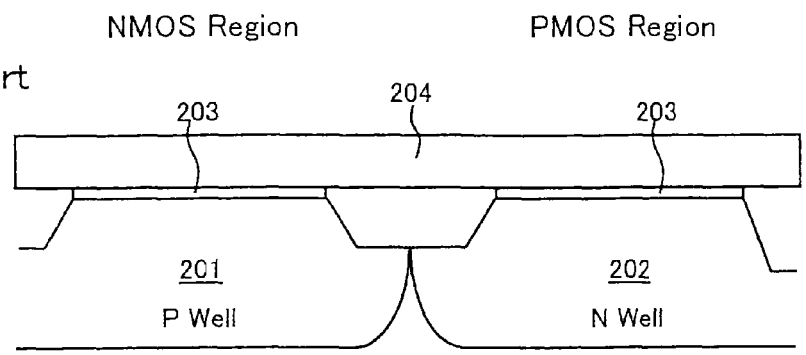
FIGS. 2A to 2C are cross-sectional views schematically showing a method for producing a CMOS semiconductor device according to a conventional technique.
Figure 2B:
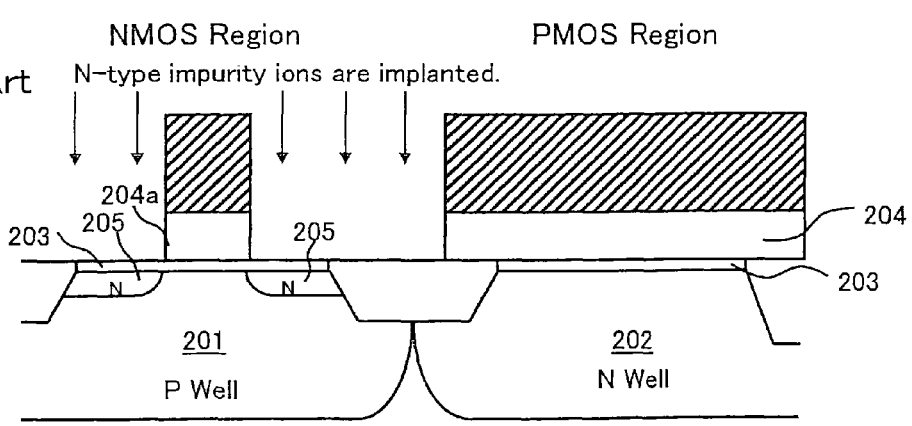
Figure 2C:
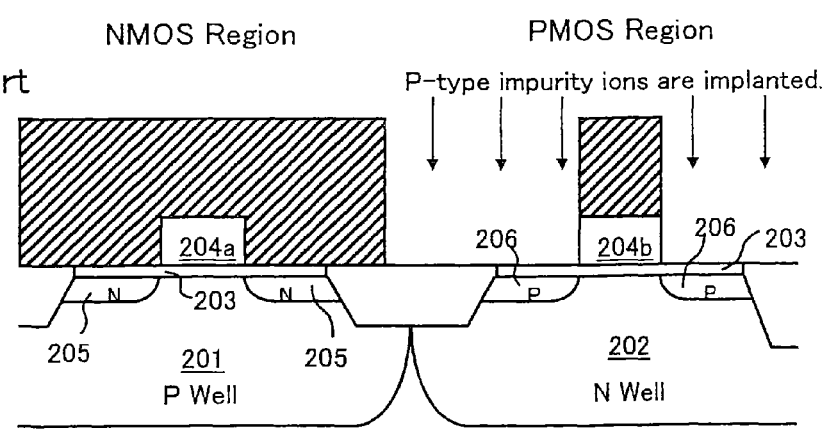
Figure 3A:
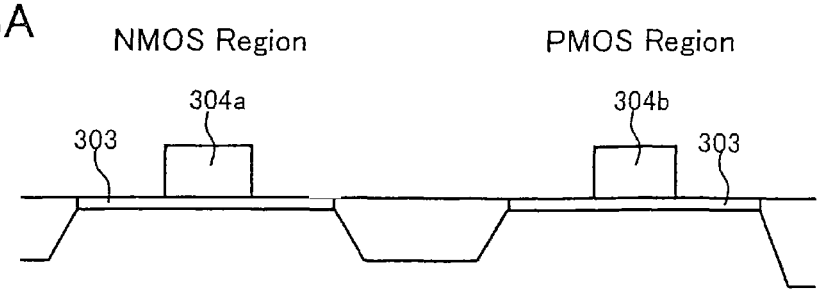
FIGS. 3A to 3C are cross-sectional views schematically showing a method for producing a CMOS semiconductor device according to the present invention.
Figure 3B:
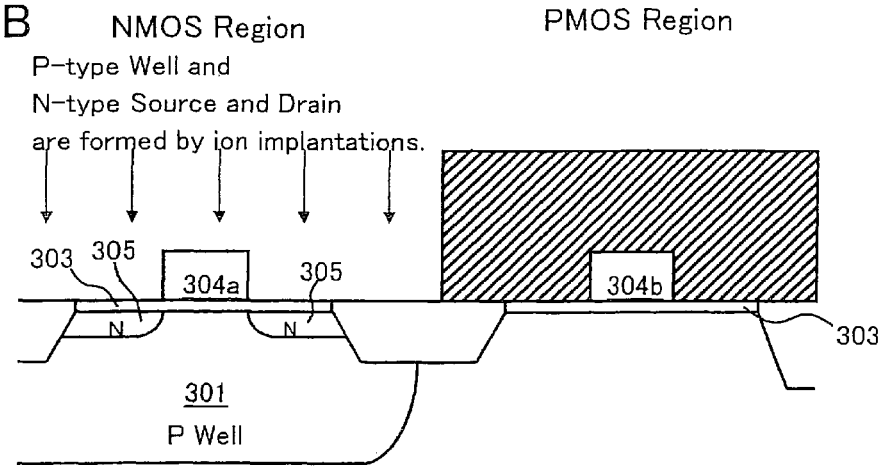
Figure 3C:
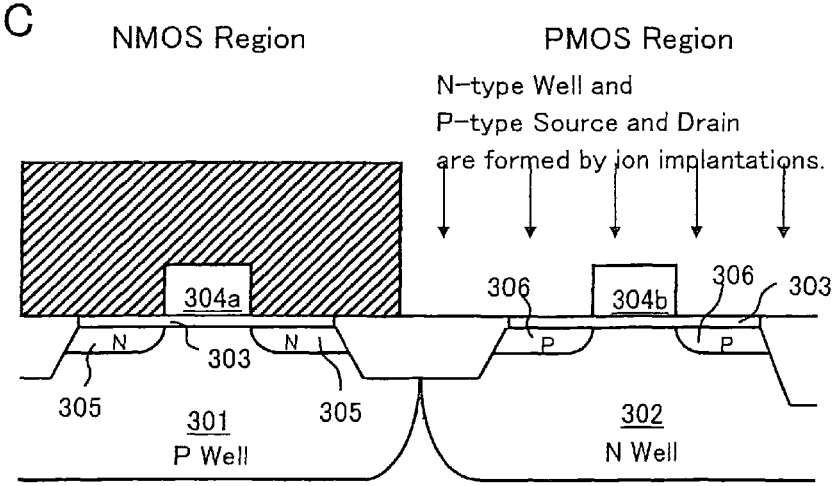

Hereinafter, description will be made in detail of a method for producing a semiconductor device according to one embodiment of the present invention (hereinafter, referred to as the "method of the present invention" occasionally). FIGS. 3A to 3C are cross-sectional views schematically showing steps of producing the semiconductor device of the present invention. In addition, in the cross-sectional views of the steps in FIGS. 3A to 3C, an essential part is emphasized as necessary, and a dimension ratio of components in the drawing does not always coincide with an actual dimension ratio thereof.

First, an element isolation film and a gate insulation film 303 are formed on a semiconductor substrate. Thus, an NMOS region and a PMOS region are isolated by the element isolation film on the substrate. In addition, the gate insulation film 303 is formed on a substrate surface in each of the NMOS region and the PMOS region.

Then, polysilicon is deposited on a whole surface of the gate insulation film 303 as a gate electrode material. Then, the PMOS region in which a gate electrode is formed and the NMOS region in which a gate electrode is formed are covered with a mask, and a gate electrode 304a and a gate electrode 304b are formed in the NMOS region and the PMOS region, respectively by etching at the same time. Thereafter, the resist mask is removed. FIG. 3A shows a cross-sectional structure at this time.

Then, a thermally oxidized film is formed in polysilicon on an exposed surface of the gate electrode, and the PMOS region is covered with a mask, and ion implantations are performed with a common mask pattern, to form a P-type well 301 and N-type source and drain regions 305, in the NMOS region. Here, the P-type well having a deepness of about 800 nm is formed by ion implantations in plural stages (three stages, for example) with different implantation energies of 50 to 300 keV, using boron (B) as a P-type impurity. Among the three stages of ion implantation, the implantation to adjust a threshold voltage is performed with the lowest implantation energy of 50 keV or more which is higher than that of the conventional example, in order to form a P-type channel region just under the gate electrode more deeply than a thickness (200 nm to 300 nm) of the gate electrode. In addition, the N-type source and drain regions having a deepness of 100 to 200 nm are formed by an ion implantation with an implantation energy of 30 to 40 keV using arsenic (As) as an N-type impurity. FIG. 3B shows a cross-sectional structure at this time.

Then, the NMOS region is covered with a mask, and ion implantations are performed with a common mask pattern, to form an N-type well 302 and P-type source and drain regions 306, in the PMOS region. Here, the N-type well having a deepness of about 900 nm is formed by ion implantations in plural stages (three stages, for example) with different implantation energies of 150 to 700 keV, using phosphorus (P) as an N-type impurity. Among the three stages of ion implantation, the implantation to adjust a threshold voltage is performed with the lowest implantation energy of 150 keV or more which is higher than that of the conventional example, in order to form an N-type channel region just under the gate electrode more deeply than a thickness (200 nm to 300 nm) of the gate electrode. In addition, the P-type source and drain regions having a deepness of 100 to 200 nm are formed by an ion implantation with an implantation energy of 20 to 30 keV using $BF_2$ as a P-type impurity. FIG. 3C shows a cross-sectional structure at this time.

Thereafter, a heat treatment (at 900° C. for 30 minutes in a nitrogen gas, for example) is performed to thermally activate the impurity ions, whereby the P-type well 301 and the N-type source and drain regions 305 are formed in the NMOS region, and the N-type well 302 and the P-type source and drain regions 306 are formed in the PMOS region, and as a result, an N-channel transistor is formed in the NMOS region, and a P-channel transistor is formed in the PMOS region.

According to the method of the present invention, the required number of resist masks is only three such as the mask necessary for etching the gate electrodes in the NMOS region and the PMOS region, the mask to cover the PMOS region to form the P-type well and the N-type source and drain regions in the NMOS region, and the mask to cover the NMOS region to form the N-type well and the P-type source and drain regions in the PMOS region, so that the number of mask steps can be reduced by one step as compared with the conventional technique, and process cost can be reduced.

Second Embodiment

Next, a production method in a case where transistors formed in the NMOS region and the PMOS region have LDD structures will be described below. FIGS. 4A to 4C are cross-sectional views schematically showing steps of producing a semiconductor device according to the present embodiment. In the cross-sectional views of the steps in FIGS. 4A to 4C, an essential part is emphasized as necessary, and a dimension ratio of components in the drawing does not always coincide with an actual dimension ratio thereof.

First, similar to the first embodiment, an element isolation film and a gate insulation film 403 are formed on a semiconductor substrate. Then, polysilicon is deposited on a whole surface of the gate insulation film 403 as a gate electrode material. Then, a gate electrode 404a and a gate electrode 404b are formed in the NMOS region and the PMOS region, respectively by etching at the same time. Thereafter, a resist mask is removed. A cross-sectional structure at this time is the same as that of the first embodiment in FIG. 3A. Then, a thermally oxidized film is formed in polysilicon on an exposed surface of the gate electrode.

Next, the PMOS region is covered with a mask, and ion implantations are performed with a common mask pattern, to form a P-type well 401 and N-type low concentration source and drain regions (first diffusion regions) 405, in the NMOS region. Here, the P-type well having a deepness of about 800 nm is formed by ion implantations in plural stages (three stages, for example) with different implantation energies of 50 to 300 keV, using boron (B) as a P-type impurity. Among the three stages of ion implantation, the implantation to adjust a threshold voltage is performed with the lowest implantation energy of 50 keV or more which is higher than that of the conventional example, in order to form a P-type channel region just under the gate electrode more deeply than a thickness (200 nm to 300 nm) of the gate electrode. In addition, the N-type low concentration source and drain regions having a deepness of 100 nm are formed by an ion implantation with an implantation energy of 15 to 20 keV, using phosphorus (P) as an N-type impurity.

In addition, a pocket implantation is performed to prevent a short channel effect, in which P-type impurity ions (such as boron) are implanted from an oblique direction (tilted at 25 to 30 degrees with respect to a vertical direction of the substrate, for example) while the substrate is rotated. Thus, P-type high concentration impurity regions 407 can be formed in the channel region between the N-type low concentration source and drain regions 405. FIG. 4A shows a cross-sectional structure at this time.

Then, the NMOS region is covered with a mask, and ion implantations are performed with a common mask pattern, to form an N-type well 402 and P-type low concentration source and drain regions (first diffusion regions) 406, in the PMOS region. Here, the N-type well having a deepness of about 900 nm is formed by ion implantations in plural stages (three stages, for example) with different implantation energies of 150 to 700 keV, using phosphorus (P) as an N-type impurity. Among the three stages, the implantation to adjust a threshold voltage is performed with the lowest implantation energy of 150 keV or more which is higher than that of the conventional example, in order to form an N-type channel region just under the gate electrode more deeply than a thickness (200 nm to 300 nm) of the gate electrode. In addition, the P-type low-concentration source and drain regions having a deepness of 150 nm are formed by an ion implantation with an implantation energy of 10 to 15 keV, using $BF_2$ as a P-type impurity.

In addition, a pocket implantation is performed to prevent a short channel effect, in which N-type impurity ions (such as phosphorus) are implanted from an oblique direction (tilted at 25 to 30 degrees with respect to the vertical direction of the substrate, for example) while the substrate is rotated. Thus, N-type high concentration impurity regions 408 can be formed in the channel region between the P-type low concentration source and drain regions 406. FIG. 4B shows a cross-sectional structure at this time.

Thereafter, the resist mask is removed, and an insulation film (such as SiN) is deposited on the whole surface, and the insulation film is removed by anisotropic etching, except for sidewall insulation films formed on sidewalls of the gate electrodes 404a and 404b. Then, the PMOS region is covered with a resist, and an ion implantation is performed in order to form N-type high concentration source and drain regions (second diffusion region) 409 in the NMOS region, using the gate electrode 404a and its sidewall insulation film as a mask. The N-type high concentration source and drain regions having a deepness of 100 to 200 nm can be formed by the ion implantation with an implantation energy of 30 to 40 keV, using arsenic (As) as an N-type impurity.

In addition, at this time, when the resist mask has an opening part in a region of contact with the substrate in the PMOS region, the ion implantation to form the N-type high concentration source and drain regions 409 in the NMOS region, and an ion implantation to form an N-type high concentration impurity region (third diffusion region) to supply a potential to the substrate in the PMOS region can be performed with the same resist pattern at the same time.

Then, the NMOS region is covered with a resist, and an ion implantation is performed in order to form P-type high concentration source and drain regions (second diffusion regions) 410 in the PMOS region, using the gate electrode 404b and its sidewall insulation film as a mask. The P-type high concentration source and drain regions having a deepness of 200 to 300 nm can be formed by the ion implantation with an implantation energy of 15 to 20 keV, using $BF_2$ as a P-type impurity.

In addition, at this time, when the resist mask has an opening part in a region of contact with the substrate in the NMOS region, the ion implantation to form the P-type high concentration source and drain regions 410 in the PMOS region, and an ion implantation to form a P-type high concentration impurity region (third diffusion region) to supply a potential to the substrate in the NMOS region can be performed with the same resist pattern at the same time.

Thereafter, a heat treatment (annealing at 850° C. in a nitrogen gas for about 30 minutes, or ramp annealing at 1000° C.) is performed to thermally activate the impurity ions, whereby the P-type well 401 and the N-type low concentration source and drain regions 405 are formed in the NMOS region, and the N-type well 402 and the P-type low concentration source and drain regions 406 are formed in the PMOS region.

Thus, as shown in FIG. 4C, a transistor having the N-type low concentration source and drain regions 405, the N-type high concentration source and drain regions 409, and the P-type high concentration impurity region 407 is formed in the NMOS region, and a transistor having the P-type low concentration source and drain regions 406, the P-type high concentration source and drain regions 410, and the N-type high concentration impurity region 408 is formed in the PMOS region.

When the transistor having the LDD structure is formed by the above production method, the ion implantations for forming the well and the low concentration source and drain regions can be performed with the common mask pattern, so that the number of mask steps is reduced as compared with the case where the transistor having the LDD structure is formed by the conventional production method, and process cost can be reduced.

Hereinafter, a description will be made of another embodiment of the production method of the present invention.

(1) For example, according to the above embodiments, while the ion implantations to form the P well and the N-type source and drain regions are performed in the NMOS region and then the ion implantations to form the N well and the P-type source and drain regions are performed in the PMOS region in the present embodiment, the order of the ion implantations in the NMOS region and the ion implantations in the PMOS region may be reversed.

(2) In addition, according to the above embodiments, while the description has been made of the method for producing the semiconductor device in the CMOS process in the present embodiment, the method for producing the semiconductor device in the present invention may be applied to an NMOS process including only the NMOS region, and a PMOS process including only the PMOS region. Thus, when impurity ion implantations to form a well and source and drain regions are performed with the common mask pattern, the number of mask steps can be reduced and process cost can be reduced.

The present invention can be applied to a method for producing a semiconductor production device, and especially applied to a method for producing a CMOS-type semiconductor device by which the number of mask steps is reduced and accordingly process cost is reduced.

Although the present invention has been described in terms of a preferred embodiment, it will be appreciated that various modifications and alterations might be made by those skilled in the art without departing from the invention. The invention should therefore be measured in terms of the claims which follow.

What is claimed is:

1. A method for producing a semiconductor device, comprising:
    forming an element isolation film in an element isolation region in a substrate;
    forming a first conductivity type or second conductivity type well in an active region separated by the element isolation film;
    forming a gate insulation film on the active region separated by the element isolation film;
    forming a source region and a drain region having a conductivity type opposite to the conductivity type of the well, in a part of a surface of the substrate in each active region; and
    forming a gate electrode on the gate insulation film over a channel region formed between the source region and the drain region, wherein
    after the step of forming the gate electrode, the step of forming the well and at least part of the step of forming the source region and the drain region are performed by ion implantations with the same resist mask.

2. The method according to claim 1, wherein
    the step of forming the source region and the drain region includes forming a first low concentration diffusion region having a conductivity type opposite to the conductivity type of the well, and forming a second high concentration diffusion region having a conductivity type opposite to the conductivity type of the well, and
    the step of forming the well, and the step of forming the first diffusion region are performed by ion implantations with the same resist mask.

3. The method according to claim 2, further comprising
    forming a pocket implantation region having a conductivity type opposite to the conductivity type of the first diffusion region by an ion implantation, in the channel region along a side surface of the first diffusion region, after the step of forming the gate electrode, and before the step of forming the second diffusion region.

4. The method according to claim 1, wherein
    after the step of forming the gate electrode, and
    after forming a first resist mask having an opening part in a first active region of the active region in the substrate, and covering at least one part of a second active region of the active region except for the first active region,
    the second conductivity type well, and the first conductivity type source region and the drain region are formed in the first active region by ion implantations, using the first resist mask as a mask, and
    after forming a second resist mask having an opening part in the second active region and covering the first active region,
    the first conductivity type well, and the second conductivity type source region and drain region are formed in the second active region by ion implantations, using the second resist mask as a mask.

5. The method according to claim 1, wherein the first conductivity type or second conductivity type well is formed by ion implantations in plural stages at different implantation energies.

6. The method according to claim 1, wherein the well is formed by ion implantations after the step of forming the gate electrode, the well extending beneath the gate electrode.

* * * * *